United States Patent [19]
Bateman et al.

[11] Patent Number: 4,841,497
[45] Date of Patent: Jun. 20, 1989

[54] DIGITAL TIME BASE WITH CORRECTED ANALOG INTERPOLATION

[75] Inventors: Glenn Bateman, Redmond, Oreg.; Donald L. Brand, North Ridge, Calif.

[73] Assignee: Tektronix, Inc., Beaverton, Oreg.

[21] Appl. No.: 129,619

[22] Filed: Dec. 7, 1987

[51] Int. Cl.[4] .............................................. H03K 13/20
[52] U.S. Cl. .................................... 368/113; 368/117; 341/120
[58] Field of Search ........................ 368/113, 117–120; 328/185; 341/120–121; 364/569

[56] References Cited

U.S. PATENT DOCUMENTS

| | | | |
|---|---|---|---|
| 3,493,961 | 2/1970 | Hansen | 341/120 |
| 3,750,142 | 7/1973 | Barnes et al. | 347/120 |
| 3,949,393 | 4/1976 | Bjornsen et al. | 340/347 CC |
| 4,214,234 | 7/1980 | Cunningham, Jr. | 340/347 AD |
| 4,581,585 | 4/1986 | Bristol | 328/185 |

Primary Examiner—Vit W. Miska
Attorney, Agent, or Firm—Francis I. Gray; William K. Bucher

[57] ABSTRACT

A digital time base with analog interpolation provides a variable reference voltage to assure that the period of an analog ramp between a zero value and a maximum value is equal to the time interval between range clock pulses. A time base error is determined by establishing a zero reference level on a test pulse rising edge corresponding to the zero value of the analog ramp, and then establishing a maximum level on the test pulse corresponding to the maximum value of the analog ramp initiated one clock pulse prior to the test pulse. The difference between the two levels on the test pulse represents the time base error. A microprocessor provides a corrected reference voltage as the maximum value so that the maximum delay of the analog ramp equals the time interval between clock pulses.

4 Claims, 2 Drawing Sheets

ID_ANALOG INTERPOLATION

BACKGROUND OF THE INVENTION

The present invention relates to digital time bases, and more particularly to a digital time base with corrected analog interpolation having a total analog ramp delay exactly equal to a digital time delay.

In time domain reflectometers (TDR), such as the OF150 manufactured by Tektronix, Inc. of Beaverton, Oreg., United States of America, energy pulses are transmitted into a cable at a given pulse repetition rate depending upon the designed range of the TDR. Reflections from flaws, discontinuities or breaks in the cable are timed from the time of transmission of the energy pulse to determine the range from the transmitter of such flaw, discontinuity or break. To determine the range a clock provides a plurality of range pulses between energy pulses. The time interval between the clock pulses is a coarse determination of time which is a measure of range, i.e., for a 20 MHz clock the coarse time interval is to the nearest 50 nsec. To obtain finer time resolution an analog ramp is generated between clock pulses starting at a zero value at one pulse and terminating at a maximum value at the next pulse, i.e., the analog ramp goes from zero to maximum in 50 nsec. The ramp is sampled by comparing the ramp with a comparator voltage level which is set to occur when the reflection is received. The value of the ramp when the reflection is received determines the delta time, and therefore the delta range, between the clock pulses to be added to the coarse range as determined by the summation of the clock pulses occurring prior to the reflection receipt. If the ramp slope, due to aging of components, temperature variations or other effects, is not precise, the ramp may reach the maximum value either prior to or after the next pulse, resulting in a distortion in the range of the reflected signal being observed on the TDR display.

Therefore what is desired is a means for calibrating the analog ramp so that the time difference between the zero and maximum values is essentially equal to the digital time interval between clock pulses.

SUMMARY OF THE INVENTION

Accordingly the present invention provides a digital time base with corrected analog interpolation which uses a variable reference value as a maximum value for comparison with an analog ramp. A test pulse with a fast rising edge provides an arbitrary reference which is fixed in time relative to a clock pulse. With a zero value reference for the analog ramp the time of occurrence is determined with respect to the test pulse. Then the ramp is started at a clock pulse immediately prior to the clock pulse for the test pulse and a maximum value reference is set for the analog ramp. The difference in time between the zero and maximum values of the analog ramp with respect to the test pulse is a measure of the time error of the analog ramp. The variable reference value is adjusted until the measured time error is approximately zero within predetermined tolerances.

The objects, advantages and other novel features of the present invention will be apparent from the following detailed description when read in conjunction with the appended claims and attached drawing.

DESCRIPTION OF THE PREFERRED EMBODIMENT

Figure 1:
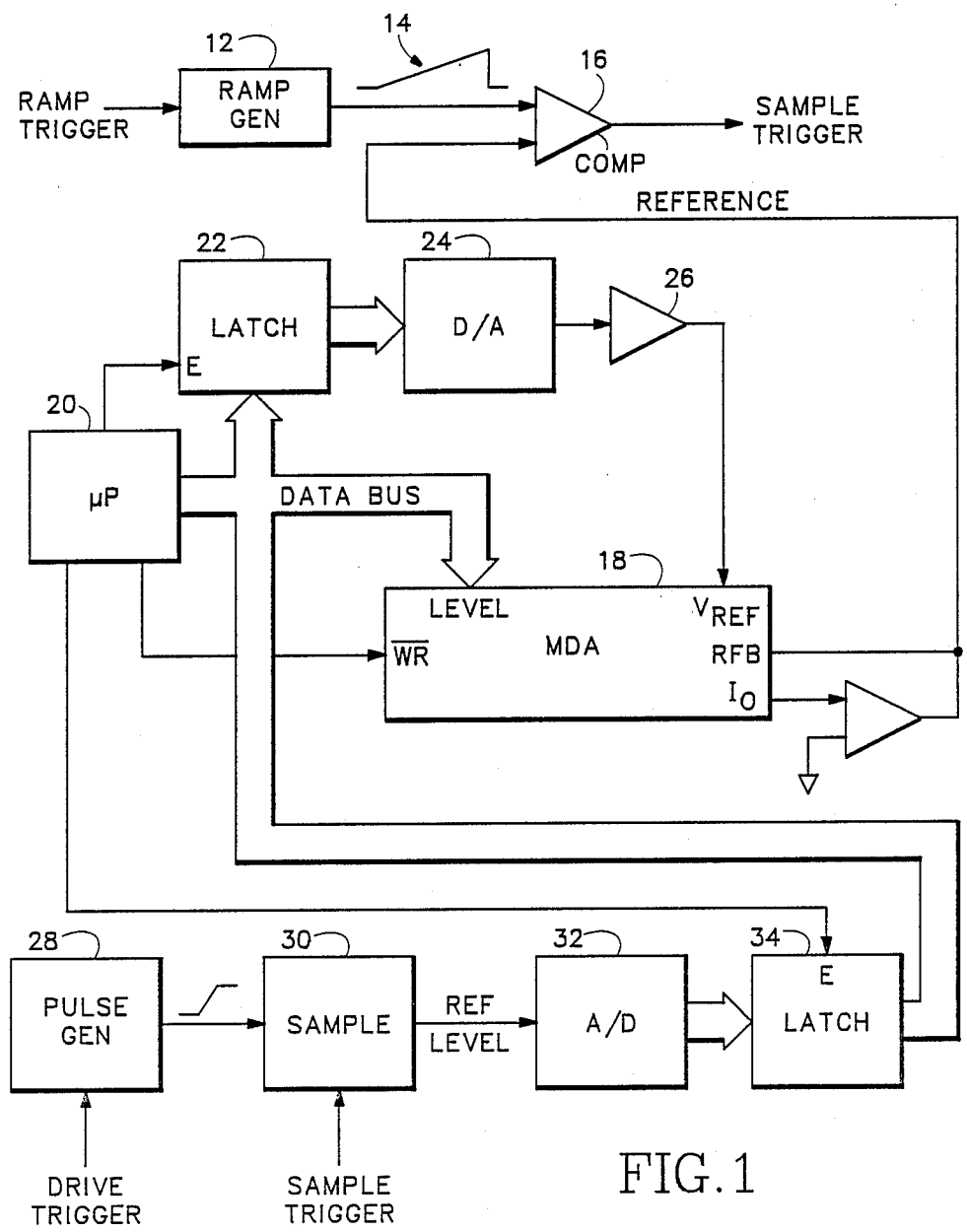
FIG. 1 is a block diagram of a digital time base with analog interpolation according to the present invention.

Referring now to FIG. 1 a microprocessor controlled digital time base with analog interpolation is shown. A ramp trigger is input to a ramp generator 12 to generate an analog ramp 14 having a period from minimum to maximum values approximately equal to the time interval between consecutive digital clock pulses, i.e., 50 nsec for a 20 MHz clock. The analog ramp 14 is input to a comparator circuit 16 to generate a sample pulse when the analog ramp value exceeds a reference value. The reference value is derived from a multiplying digital to analog converter (MDA) 18 which has as inputs a reference voltage Vref corresponding to the maximum ramp value and a digital ramp level command from a microprocessor 20 as determined by an operator from a front panel control. To set the reference voltage Vref a digital reference level from the microprocessor 20 is input to a latch 22. Upon an appropriate command from the microprocessor 20 the input to the latch 22 is transferred to the latch output and held. The output of the latch 22 is converted to a current signal by a digital to analog converter 24, and the current signal is converted to the reference voltage Vref by a current to voltage converter circuit 26.

Figure 2:
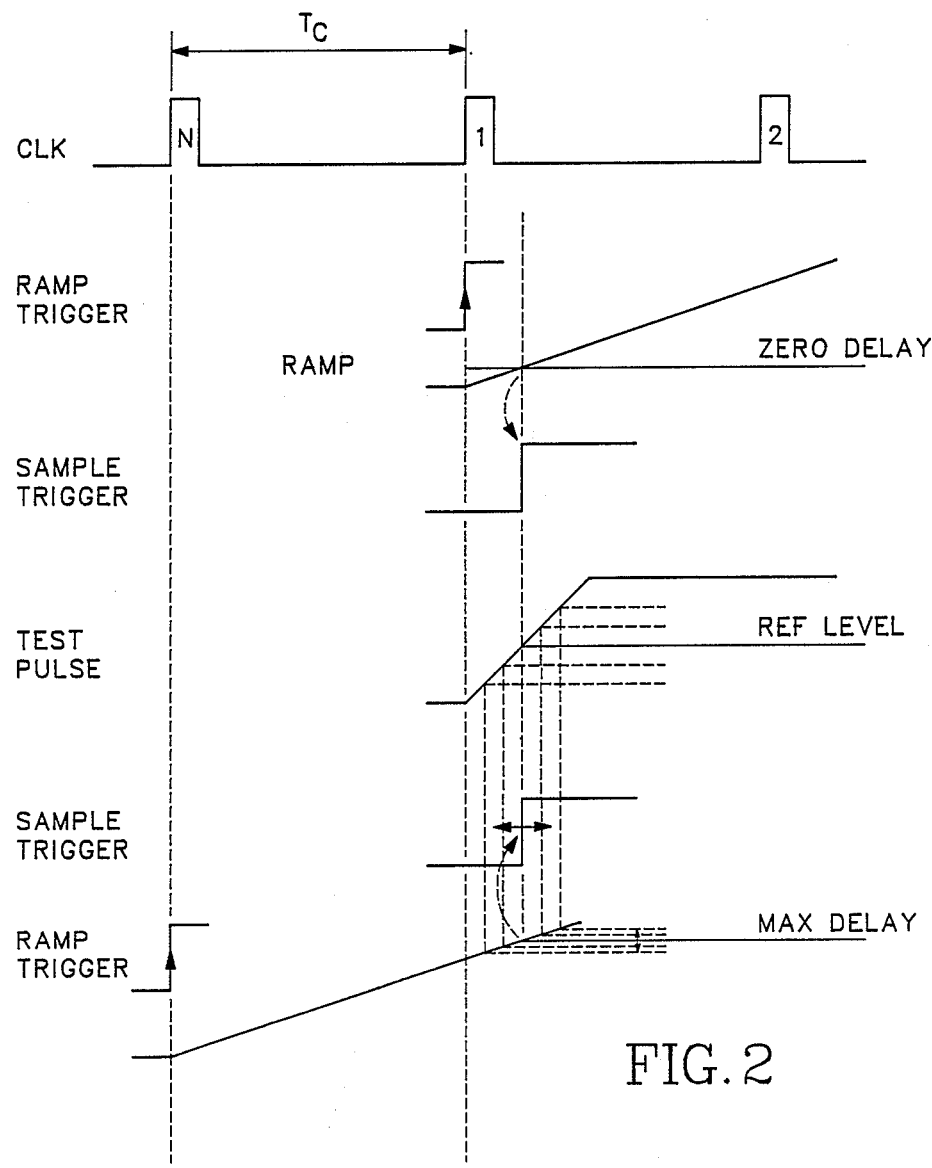
FIG. 2 is a graph illustrating the calibration technique of the present invention.

The period of the analog ramp 14 may be adjusted by either varying the slope or by varying the maximum amplitude value, i.e., by varying Vref. Varying the slope requires varying the resistance or capacitance of an RC circuit in the ramp generator 12, or by varying the bias current of a current source in the ramp generator. However, the present embodiment which is described varies the reference voltage Vref. A test pulse, which may be either derived from an internal drive trigger of the TDR or from an external source, is generated by a pulse generator circuit 28 in synchronization with a clock signal as shown in FIG. 2. An arbitrary reference level of the test pulse, such as the fifty percent point of the rising slope, is determined. Since there are N clock pulses per test pulse, clock pulse #1 identifies the start of the test pulse. A zero value from the microprocessor 20 is written into the MDA 18 and the output Io from the MDA represents a voltage corresponding to the zero level of the analog ramp. When the analog ramp value, the analog ramp being started by the ramp trigger pulse in synchronization with clock pulse #1, exceeds the zero value from the MDA 18, a sample pulse is generated which samples the test pulse in a sampling circuit 30 to establish the arbitrary reference level of the test pulse. The reference level is converted to a digital value by an analog to digital converter 32 and stored in a latch 34 for transfer to the microprocessor 20.

For the next test pulse the ramp trigger to start the analog ramp is generated at clock pulse #N, the clock pulse just prior to clock pulse #1. A value from the microprocessor 20 which is equal to Vref is loaded into the MDA 18 which outputs Vref on line RFB. Ideally the sample pulse generated by the of Vref with the analog ramp occurs at the same point on the test pulse as for the zero value, i.e., at the reference level. If there is a time error, however, the sample pulse for the maximum value occurs either before or after the time corresponding to the reference level on the test pulse, i.e., the level of the test pulse sampled by the sample pulse will be different from the held reference level and is transferred to the microprocessor 20 to determine a time error. This time error is in the form of a voltage difference, either plus or minus. Based upon the time error the microprocessor 20 generates a corrected value for Vref which is input to the latch 22 and transferred to the D/A 24 for generation via the amplifier 26 into a new Vref. The calibration as indicated above is performed again and a new time error determined to further refine Vref. This process continues until the time error is zero or is less than a predetermined limit, such as the value for the least significant bit of the level command from the microprocessor 20.

Thus the present invention provides a digital time base with analog interpolation which has an analog interpolation ramp with a period, or total delay, equal to the digital interval, or delay, between range clock pulses to provide accurate range measurements of flaws, discontinuities or breaks in a cable by a TDR.

What is claimed is:

1. A method for calibrating an analog ramp for a digital time base with analog interpolation comprising the steps of:
   a. initiating the analog ramp and a test pulse at a first clock pulse time;
   b. comparing the analog ramp with a zero ramp value to establish a zero delay reference level for the test pulse;
   c. initiating the analog ramp one clock pulse interval prior to the first clock pulse initiating the test pulse;
   d. comparing the analog ramp with a maximum ramp value to establish a maximum delay level for the test pulse;
   e. determining from the zero delay reference level and the maximum delay level a time base error;
   f. adjusting the maximum ramp value to compensate for the time base error.

2. A method as recited in claim 1 further comprising the step of repeating steps c-f with the adjusted maximum ramp value until the time base error is less than a predetermined limit.

3. A digital time base with analog interpolation comprising:
   means for generating an analog ramp signal in response to a ramp trigger;
   means for comparing the analog ramp signal with a signal level which varies between a zero value and a maximum value to establish an interval along the analog ramp signal; and
   means for adjusting the maximum value so that the interval is a predetermined value.

4. A digital time base as recited in claim 3 wherein the adjusting means comprises:
   means for storing a reference value corresponding to the maximum value; and
   means for correcting the reference value in the storing means when the interval is not equal to the predetermined value within a predetermined limit.

* * * * *